(12) United States Patent
Erol

(10) Patent No.: US 7,512,205 B1
(45) Date of Patent: Mar. 31, 2009

(54) BAUD RATE GENERATION USING PHASE LOCK LOOPS

(75) Inventor: Kaan Erol, San Francisco, CA (US)

(73) Assignee: Network Equipment Technologies, Inc., Fremont, CA (US)

( * ) Notice: Subject to any disclaimer, the term of this patent is extended or adjusted under 35 U.S.C. 154(b) by 584 days.

(21) Appl. No.: 11/153,039

(22) Filed: Jun. 14, 2005

Related U.S. Application Data

(60) Provisional application No. 60/658,044, filed on Mar. 1, 2005.

(51) Int. Cl.
   *H03D 3/24* (2006.01)
(52) U.S. Cl. ........................ 375/376; 375/375
(58) Field of Classification Search ............... 375/371, 375/372, 373, 374, 375, 376
   See application file for complete search history.

(56) References Cited

U.S. PATENT DOCUMENTS

| | | | | |
|---|---|---|---|---|
| 4,679,003 A | * | 7/1987 | Sagawa et al. | 331/1 A |
| 5,329,253 A | * | 7/1994 | Ichihara | 331/17 |
| 5,477,330 A | * | 12/1995 | Dorr | 358/296 |
| 5,495,206 A | * | 2/1996 | Hietala | 331/1 A |
| 5,521,948 A | * | 5/1996 | Takeuchi | 375/376 |
| 5,604,774 A | * | 2/1997 | Rokugo et al. | 375/376 |
| 5,610,955 A | * | 3/1997 | Bland | 375/376 |
| 5,631,587 A | * | 5/1997 | Co et al. | 327/107 |
| 5,631,920 A | * | 5/1997 | Hardin | 375/130 |
| 5,764,711 A | * | 6/1998 | Jokura | 375/376 |
| 5,774,511 A | * | 6/1998 | Boerstler | 375/376 |
| 6,094,569 A | * | 7/2000 | Wang | 455/313 |
| 6,366,174 B1 | * | 4/2002 | Berry et al. | 331/78 |
| 6,704,383 B2 | * | 3/2004 | Lee et al. | 375/376 |
| 6,914,935 B2 | * | 7/2005 | Eklof | 375/238 |
| 6,919,744 B2 | * | 7/2005 | Paist et al. | 327/115 |
| 6,946,884 B2 | * | 9/2005 | Holland et al. | 327/115 |
| 6,985,551 B1 | * | 1/2006 | Mattisson et al. | 375/376 |
| 7,015,733 B2 | * | 3/2006 | Giuroiu | 327/156 |
| 7,065,172 B2 | * | 6/2006 | Xiu et al. | 375/376 |
| 7,133,485 B1 | * | 11/2006 | Baird et al. | 375/376 |
| 7,171,182 B2 | * | 1/2007 | Filipovic | 455/258 |
| 7,336,755 B1 | * | 2/2008 | Tetzlaff | 375/376 |
| 2002/0136342 A1 | * | 9/2002 | Lee et al. | 375/376 |
| 2006/0133559 A1 | * | 6/2006 | Glass | 375/376 |

* cited by examiner

*Primary Examiner*—Chieh M Fan
*Assistant Examiner*—Jason M. Perilla
(74) *Attorney, Agent, or Firm*—Townsend and Townsend and Crew

(57) ABSTRACT

A single stage phase lock loop (PLL) is provided. The phase lock loop receives a reference clock frequency and is configured to output a PLL output frequency. The PLL output frequency is generated based on the reference clock frequency and a comparison clock frequency that is outputted by a modulator. An output divider is then applied to the PLL output frequency to generate a system output frequency. The modulator is configured to output a comparison clock frequency that is either a modulated clock frequency or unmodulated clock frequency. The modulated clock frequency and unmodulated clock frequency are alternatively generated based on a schedule. The desired rate may be at a granularity finer than a granularity that can be achieved by dividing the reference clock frequency by an integer.

15 Claims, 4 Drawing Sheets

BAUD RATE GENERATION USING PHASE LOCK LOOPS

CROSS-REFERENCES TO RELATED APPLICATIONS

The present application is a non-provisional of and claims priority from U.S. Provisional Application No. 60/658,044, filed Mar. 1, 2005, the entire contents of which are herein incorporated by reference for all purposes.

BACKGROUND OF THE INVENTION

The present invention generally relates to telecommunications and more specifically to providing a single stage PLL circuit that can generate fine granularities of frequencies.

Phase lock loops (PLLs) are used to synthesize frequencies. A reference frequency from a reference clock is generally received and various output frequencies can be synthesized. Generally the frequencies that can be synthesized are limited to integer multiples of the reference frequency. The output frequencies can then be divided. The dividers are implemented in digital logic and are limited to integer values. This limits the frequencies that can be generated by PLL systems.

The lower the frequency of the reference clock, the finer the granularity of output frequencies that can be achieved. This is due to having a greater choice of multipliers and dividers without saturating a voltage controlled oscillator (VCO) frequency. However, a PLL cannot typically lock to a low frequency reference clock. For example, using a 256 Hz reference clock, producing output frequencies in 1 Hz granularity is not possible for certain ranges. In other words, a full range of frequencies cannot be generated using a single stage PLL with the 256 Hz reference clock.

Accordingly, if a frequency, such as, 128003 is desired, the only frequencies that can be generated are 128000 and 128008 because the granularity is 8 with frequencies between 66536-131072. Thus, frequencies can be generated in increments of 8 Hz in that range of frequencies. For devices that require finer granularities of output frequencies, users are limited to using multiple stage PLLs. However, multiple stage PLLs increase complexity on a chip or a board and also increase the cost of producing the chip or the board. With space on a chip or a board being very valuable, it may not be desirable to have a multiple stage PLL.

BRIEF SUMMARY OF THE INVENTION

Embodiments of the present invention generally relate to providing a single stage PLL circuit that can generate granularities of frequencies finer than that provided by using integer dividers.

In one embodiment, a single stage phase lock loop (PLL) is provided. The phase lock loop receives a reference clock frequency and is configured to output a PLL output frequency. The PLL output frequency is generated based on the reference clock frequency and a comparison clock frequency that is outputted by a modulator. An output divider is then applied to the PLL output frequency to generate a system output frequency.

The modulator is configured to output a comparison clock frequency that either is a modulated clock frequency or unmodulated clock frequency. The modulated clock frequency and unmodulated clock frequency are alternatively generated based on a schedule. The alternating schedule of the modulated clock frequency and umodulated clock frequency causes the PLL output frequency generated by the PLL to vary, which varies the system output frequency. Over a period of time, the system output frequency is substantially equal to a desired rate. The desired rate may be at a granularity finer than a granularity that can be achieved by dividing the reference clock frequency by an integer multiple. Accordingly, in one embodiment, a granularity of 1 Hz, or less, may be achieved using the single stage phase lock loop.

In one embodiment, a method for providing a clock frequency using a single stage PLL circuit is provided. The method comprises: determining a desired rate, the desired rate being at a granularity lower than that provided by dividing integer multiples of the reference rate by integer dividers; determining an unmodulated rate and a modulated rate based on the desired rate; determining a schedule to modulate between the unmodulated rate and the modulated rate based on the desired rate; and modulating between the unmodulated rate and the modulated rate as input to the single PLL based on the schedule over a period of time, wherein an output rate of the PLL circuit is substantially equal to the desired rate over the period of time.

In another embodiment, a single stage phase lock loop circuit is provided. The circuit comprises: a phase lock loop configured to receive a reference clock frequency; a modulator configured to output a modulated value and an unmodulated value to the phase lock loop, wherein the modulated value and unmodulated value are alternated between based on a schedule, wherein the phase lock loop generates an output frequency based on the reference clock frequency and the modulated value or unmodulated value, wherein the modulated value and unmodulated value are alternatively received based on the schedule, wherein an output rate of the PLL is substantially equal to a desired rate being at a granularity lower than that provided by integer dividers of a multiple of the reference clock frequency.

In yet another embodiment, a single stage phase lock loop circuit is provided. The circuit comprises: a phase lock loop (PLL) configured to receive a reference clock frequency and a comparison clock frequency, wherein the PLL is configured to output a PLL output frequency; a modulated feedback divider implemented in digital logic configured to output the comparison clock frequency, wherein the modulated feedback divider is configured to output a modulated clock frequency and a unmodulated clock frequency as the comparison clock frequency, wherein the modulated clock frequency and unmodulated clock frequency are alternated between based on a schedule; and an output divider implemented in digital logic configured to output a system output frequency by dividing the PLL output frequency, wherein the system output frequency varies based on the modulated clock frequency or unmodulated clock frequency is input to the PLL as the comparison clock frequency such that the system output frequency is substantially equal to a desired rate being at a granularity lower than that provided by using integer values for the modulated feedback divider and the output divider.

A further understanding of the nature and the advantages of the inventions disclosed herein may be realized by reference of the remaining portions of the specification and the attached drawings.

DETAILED DESCRIPTION OF THE INVENTION

Figure 1:
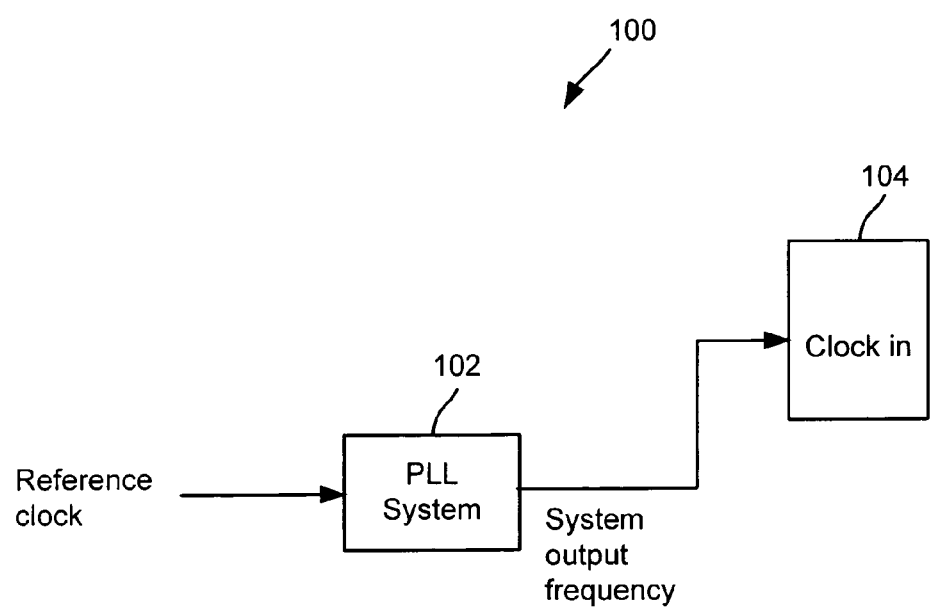
FIG. 1 depicts a system that uses a PLL system according to one embodiment of the present invention.

FIG. 1 depicts a system 100 that uses a PLL system 102 according to one embodiment of the present invention. As shown, system 100 includes PLL system 102 and a telecommunications device 104.

Telecommunications device 104 may be any telecommunications device that requires a clock input. For example, telecommunications device 104 may be any device that processes serial data. For example, an EIA 530 DTE type device.

In one embodiment telecommunications device 104 may require frequencies in granularity finer than that provided using integer dividers of the reference clock. Also, the frequencies required may be in a 1 Hz granularity, or less. For example, telecommunications device 104 may require any rate between 64 Hz and 2048000 Hz in 1 Hz granularities. Accordingly, PLL system 102 should be able to output frequencies between at 1 Hz intervals between 64 Hz-2048000 Hz. Although the above ranges are given, it should be understood that any number of ranges may be provided.

The reference clock may be from various sources. For example, a reference clock may be generated from a known clock, i.e., an oscillator or system clock. Additionally, a local clock may be derived from a network clock. Conventionally, the reference clock may be used by a PLL system to generate an output clock in granularities of integer multiples of the reference clock. The output clock can then be divided by integer values. These values may be limited to powers of 2. Using the integer values, certain frequencies cannot be generated. However, using modulation techniques described below, PLL system 102 is able to generate clock frequencies of a finer (or lower) granulation than integer multiple of the reference clock, such as in 1 Hz granularities.

Figure 2:
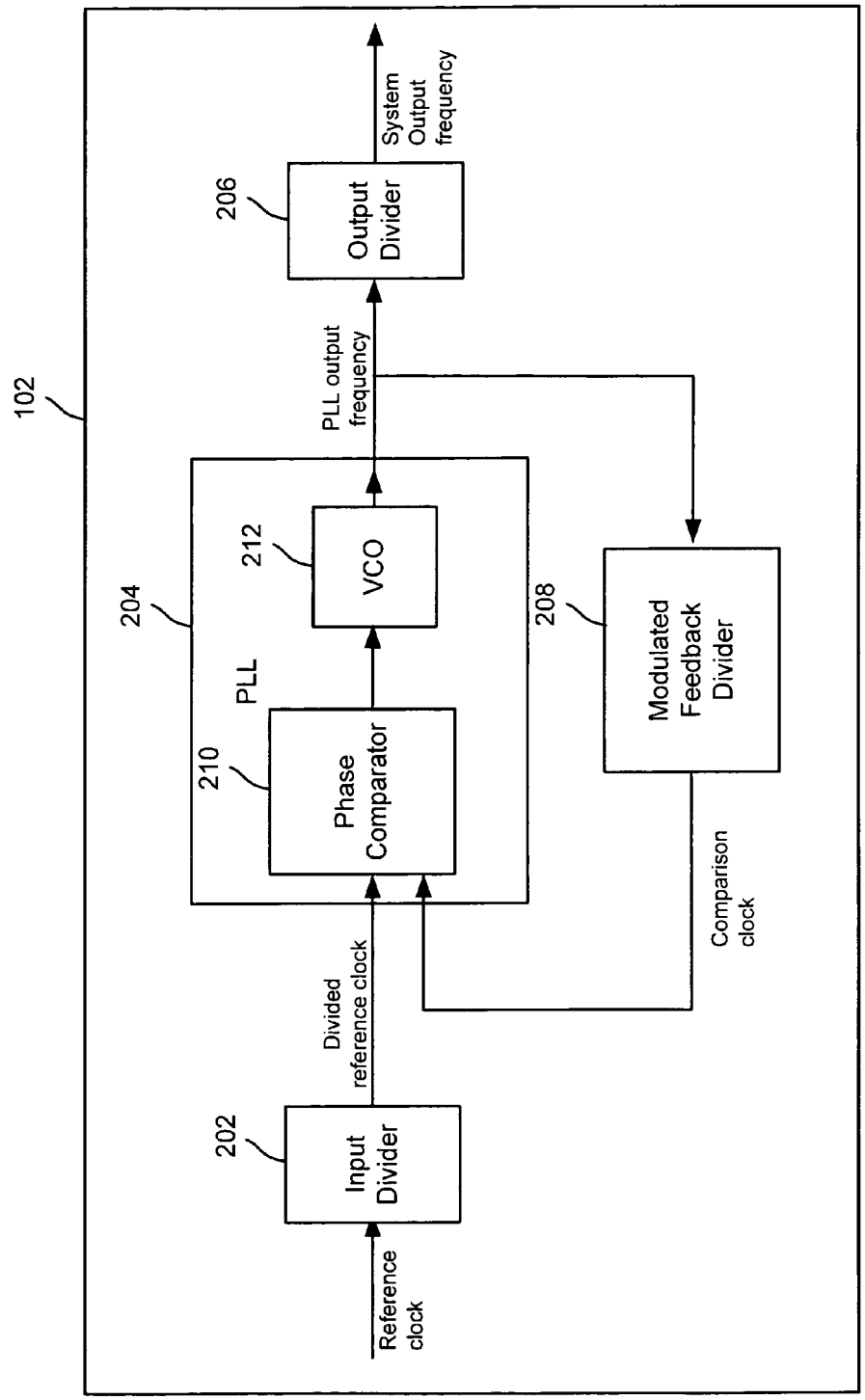
FIG. 2 depicts a more detailed embodiment of the PLL system according to one embodiment of the present invention.

FIG. 2 depicts a more detailed embodiment of PLL system 102 according to one embodiment of the present invention. As shown, an input divider 202, PLL 204, output divider 206, and modulated feedback divider 208 are provided.

Input divider 202 and output divider 206 are configured to divide a frequency that is inputted. Input divider 202 and output divider 206 may be implemented in digital logic as programmable logic devices (PLDs). A value N is provided that is used as the divider of the frequency. In one embodiment, the value of N can be an integer value or in increments of a power of 2, such as N=4, 8, 16, 32, etc. Although input divider 202 and output divider 204 are shown, it will be understood that the inputted clock may not be divided or the dividers may not be included in system 102.

PLL 204 is a phase lock loop configured to output a PLL output frequency. The PLL output frequency is generated based on one or more input clocks. For example, a divided reference clock and comparison clock are used to generate the PLL output frequency. In one embodiment, PLL 204 is implemented using a PLD.

As shown, the reference clock is received at an input divider 202. Input divider 202 is configured to divide the reference clock into a divided reference clock. By using input divider 202, smaller frequencies of the reference clock may be input into PLL 204.

A comparison clock is also inputted into PLL 204. The comparison clock is generated using modulated feedback divider 208. Modulation techniques used by modulated feedback divider 208 will be described in more detail below.

Modulated feedback divider 208 is configured to output a comparison clock. In one embodiment, modulated feedback divider 208 modulates the frequency of the outputted comparison clock. The comparison clock is modulated such that the system output frequency is substantially equal to a desired rate that can be finer than a granularity typically provided by dividers that are integer values. For example, using the modulation technique, granularities of 1 Hz may be provided for a range of frequencies. In one embodiment, modulated feedback divider 208 is implemented using a PLD.

A phase comparator 210 receives the divided reference clock and comparison clock and using known techniques outputs a clock frequency to a VCO (Voltage Controlled Oscillator) 212. A person skilled in the art will appreciate how VCO operates. VCO 212 then outputs a PLL output frequency.

The PLL output frequency can then be divided by an output divider 206 in order to output a system the desired frequency. This may be the frequency outputted by PLL system 102. Although output divider 206 is shown, it will be understood that it may not be necessary to divide the PLL output frequency.

As discussed above, in order to provide finer granularities than that provided by integer dividers of multiples the reference clock, a modulated feedback divider 208 is provided. PLL 204 may be able to generate PLL output frequencies of a certain range based on the reference clock. Modulated feedback divider 208 may then be used to divide the PLL output frequency in order to input different frequencies of the comparison clock to PLL 204. As different frequencies of the comparison clock are inputted into PLL 204, different PLL output frequencies are generated.

For example, the system output frequencies shown in Table 1 may be provided using the number "N" as the output divider 206 with using any modulation techniques as described by embodiments of the present invention.

TABLE 1

| System Output Frequencies | N (output divider) | (modulated feedback divider) = (N * Rate/512) | Reference Clock | Granularity |
|---|---|---|---|---|
| 64-128 | 65536 | As Calculated | 256 Hz | 1 |
| 128-256 | 32768 | As Calculated | 256 Hz | 1 |
| 256-512 | 16384 | As Calculated | 256 Hz | 1 |
| 512-1024 | 8192 | As Calculated | 256 Hz | 1 |
| 1024-2048 | 4096 | As Calculated | 256 Hz | 1 |
| 2048-4096 | 2048 | As Calculated | 256 Hz | 1 |
| 4096-8192 | 1024 | As Calculated | 256 Hz | 1 |
| 8192-16384 | 512 | As Calculated | 256 Hz | 1 |
| 16384-32768 | 256 | As Calculated | 256 Hz | 2 |
| 32768-66536 | 128 | As Calculated | 256 Hz | 4 |
| 66536-131072 | 64 | As Calculated | 256 Hz | 8 |
| 131072-262144 | 32 | As Calculated | 256 Hz | 16 |
| 262144-524288 | 16 | As Calculated | 256 Hz | 32 |
| 524288-1048576 | 8 | As Calculated | 256 Hz | 64 |
| 1048576-2097152 | 4 | As Calculated | 256 Hz | 128 |

Conventionally, as shown in Table 1, for a 256 Hz reference clock, granularities of 1 Hz cannot be achieved for the entire range of output frequencies (e.g., 16384 Hz-2097152 Hz). This means that 1 Hz increments of output frequencies cannot be achieved and as required output frequencies increase, the granularity goes up.

Using embodiments of the present invention, granularities of 1 Hz can be achieved over a period of time by modulating the comparison clock outputted by modulated feedback divider 208. The value of modulated feedback divider 208 may be modulated based on a desired output frequency. For example, to generate a 36001 Hz clock, a value of an output divider N=128 is used. The modulated feedback divider can be calculated as modulated feedback divider=(N*Rate)/(M). N is the value of the output divider and M is a value that is typically a power of 2. M may vary depending on the value of the reference clock. Thus, the modulated feedback divider equals (N*Rate)/512=(128*36001)/512=9000.25. As shown, this value is not an integer value. Thus, in order to generate the 36001 frequency, the feedback divider should be 9000.25. However, because digital logic is used, only integer values may be used for the dividers. Thus, 9000 is used as the unmodulated feedback divider, which generates a 36000 clock frequency. The modulated value would be (N*Rate)/512)+(1)=((128*36001)/512)+1 equals 9001. The "+1" is determined by taking the desired rate (36001) and subtracting the closest granularity that can be generated using an integer as a divider (36000). Thus, the modulated feedback divider is 9001, which generates a 36004 frequency. Modulated feedback provider 208 alternates between the modulated and unmodulated value in order to provide different comparison clocks.

The alternating is done based on a schedule. This schedule is determined based on the granularity of frequency desired. Referring to Table 1, the granularity is 4. Thus, rates in increments of 4 may be generated using integer dividers. Accordingly, for the example above, modulation needs to be done one out of every 4 cycles (i.e., the modulated comparison clock is outputted 1 out of every 4 cycles). This is because the rate is one above 36000 Hz. If the rate where 36003 Hz, then 3 cycles would be modulated out of the 4 cycles.

Over a period of time, the system output frequency is substantially equal to the desired frequency. For example, using 128 cycles as a period of time, a frequency of 36001 Hz that requires 1 modulation in every four cycles can be implemented by 32 modulations in 128 cycles. Also, 36003 Hz can be implemented by 96 modulations in 128 cycles.

In one embodiment, a Pascal triangle-like scheme is used to determine when to apply the modulated cycles. For example, if there were a total of 32 possible cycles (maximum granularity is 32), then the cycles to modulate are as follows in Table 2:

TABLE 2

| Granularity = 32 | Granularity = 16 | Granularity = 8 | Granularity = 4 | Granularity = 2 | Cycles Modulated |
|---|---|---|---|---|---|
| Rate + 0 | Rate + 0 | Rate + 0 | Rate + 0 | Rate + 0 | No Modulation |
| Rate + 1 | | | | | 16 |
| Rate + 2 | Rate + 1 | | | | 8, 24 |
| Rate + 3 | | | | | 8, 16, 24 |
| Rate + 4 | Rate + 2 | Rate + 1 | | | 4, 12, 20, 28 |
| Rate + 5 | | | | | 4, 12, 16, 20, 28 |
| Rate + 6 | Rate + 3 | | | | 4, 8, 12, 20, 24, 28 |
| Rate + 7 | | | | | 4, 8, 12, 16, 20, 24, 28 |
| Rate + 8 | Rate + 4 | Rate + 2 | Rate + 1 | | 2, 6, 10, 14, 18, 22, 26, 30 |
| Rate + 9 | | | | | 2, 6, 10, 14, 16, 18, 22, 26, 30 |
| Rate + 10 | Rate + 5 | | | | ... |
| Rate + 11 | | | | | ... |
| Rate + 12 | Rate + 6 | Rate + 3 | | | |
| Rate + 13 | | | | | |
| Rate + 14 | Rate + 7 | | | | |
| Rate + 15 | | | | | |
| Rate + 16 | Rate + 8 | Rate + 4 | Rate + 2 | Rate + 1 | All Even |
| Rate + 17 | | | | | All Odd + 16 |
| Rate + 18 | Rate + 9 | | | | All Odd + 8, 24 |
| Rate + 19 | | | | | All Odd + 8, 16, 24 |
| Rate + 20 | Rate + 10 | Rate + 5 | | | All Odd + 4, 12, 20, 28 |
| Rate + 21 | | | | | All Odd + 4, 12, 16, 20, 28 |
| Rate + 22 | Rate + 11 | | | | ... |
| Rate + 23 | | | | | ... |
| Rate + 24 | Rate + 12 | Rate + 6 | Rate + 3 | | |
| Rate + 25 | | | | | |
| Rate + 26 | Rate + 13 | | | | |
| Rate + 27 | | | | | |
| Rate + 28 | Rate + 14 | Rate + 7 | | | ... |
| Rate + 29 | | | | | All except 0, 8, 24 |
| Rate + 30 | Rate + 15 | | | | All except 0, 16 |
| Rate + 31 | | | | | All except 0 |

Table 2 provides one example of when cycles can be modulated. Although Table 2 is provided, it should be understood that other modulation schedules may be used. However, where the modulated cycles are distributed within the period of time may be important. For example, if modulated cycles are front loaded (heavy) or backend loaded (heavy), PLL 204 may be affected. For example, if the modulation is heavy, then PLL 204 may lose its lock. The reaction times on PLL 204 may be slow, so big steps should be avoided. If not PLL 204 may need time to relock to the reference clock causing unstable output during this period.

In using the above chart, if the desired system output frequency is 36001, Table 1 is used to determine the granularity. In Table 1, 36001 falls within the range 32768-66536, and thus the granularity is 4.

In Table 2, it is determined how much more the desired system output frequency is than an output frequency that is possible using dividers of integer multiples (36000 in this case). Thus, 36001 is "+1" of 36000. Table 2 shows that under column 4, row 11 that the modulated cycles are 2, 6, 10, 14, 18, 22, 26 and 30 for "rate+1" under a granularity of 4.

A modulated rate is determined that is the next highest rate in the granularity using dividers that are integer multiples. In this case, it is 36000+4=36004. The modulated rate of 36004 is generated for the modulated clock cycles and the unmodulated rate of 36000 is generated for the other clock cycles. This yields 8 clock cycles of 36004 and 24 clock cycles of 36000. The average of this over the 32 cycles equals ((36000*24)+(36004*8))/32=(864000+288032)/32=36001. Accordingly, the average system output frequency is equal to the desired output frequency. Also, the average output frequency is in a finer granularity than that possible using integer multiples for dividers without the modulation techniques provided by embodiments of the present invention. Although the schedule of cycles is provided above, it will be understood that other schedules may be used.

Figure 3:
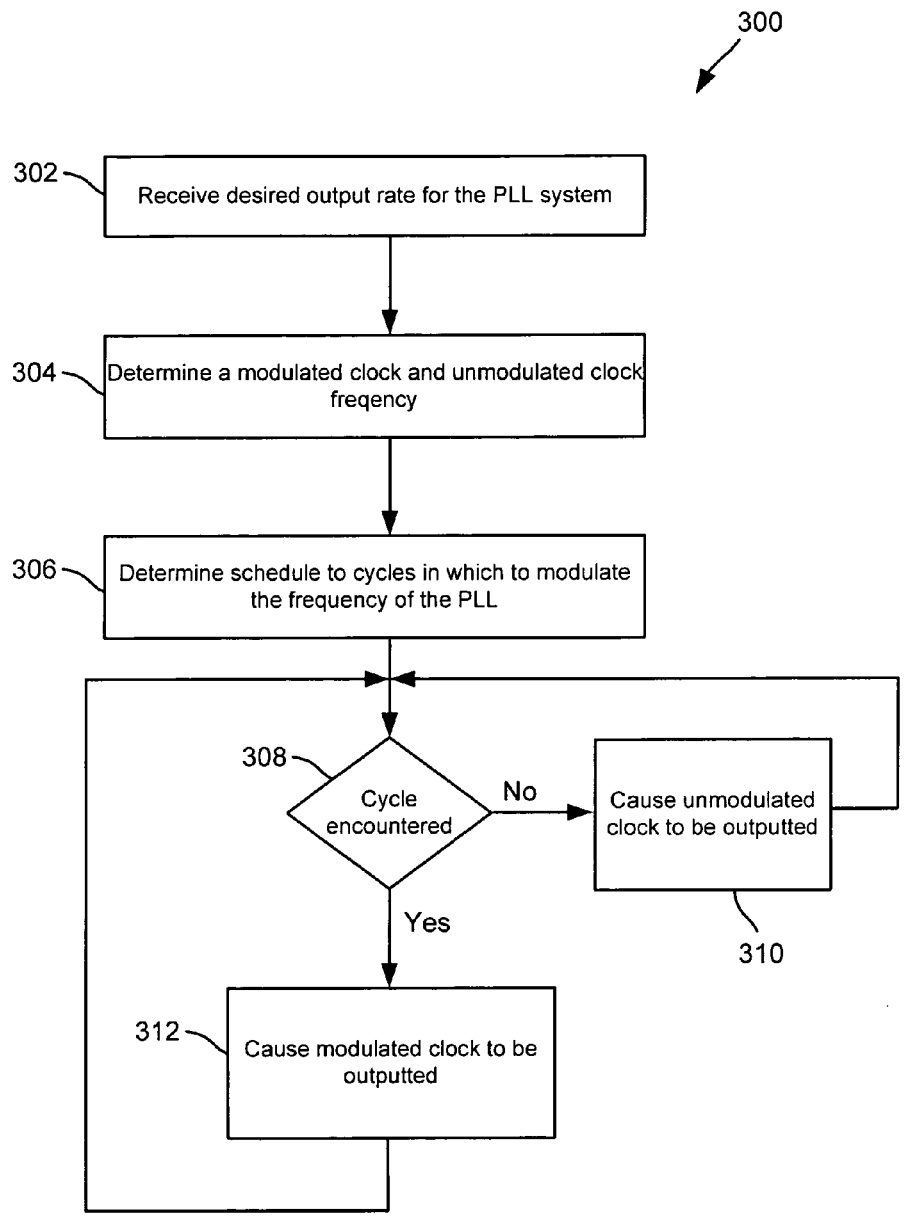
FIG. 3 depicts a simplified flowchart of a method for generating clock frequencies using a single stage PLL system according to one embodiment of the present invention.

FIG. 3 depicts a simplified flowchart 300 of a method for generating clock frequencies using a single stage PLL system 200 according to one embodiment of the present invention. In step 302, a desired output rate for the PLL system 200 is received. This rate may be in 1 Hz granularities within a range of possible clock frequencies. For example, a range of possible frequencies may be 64-2297152 in 1 Hz granularities.

In step 304, a modulated comparison clock and an unmodulated comparison clock to apply are determined. An unmodulated comparison clock is based on a clock frequency that is close to the desired rate where the dividers are implemented with integers. For example, if the desired rate is 36001, the unmodulated clock is 36000 Hz. A modulated clock may be determined based on a frequency that is the next greatest frequency divided by an integer where the desired rate is in between the unmodulated clock frequency and modulated clock frequency. Divider values in order to generate the modulated clock and the unmodulated clock are then determined. These may be determined based on values found in Table 1.

In step 306, cycles in which to modulate the frequency of PLL 102 are determined. For example, the comparison clock outputted by modulated feedback divider 208 may be varied between the modulated comparison clock and the unmodulated comparison clock. These cycles may be determined based on the schedule found in Table 2. The modulation schedule is used such that a lock may not be lost with PLL 204. Accordingly, the modulated cycles may be distributed throughout a period of time.

In step 308, it is determined if a cycle for modulation is encountered. If the cycle is not encountered, the unmodulated clock is outputted in step 310.

In step 312, if the cycle should be a modulated cycle, then the modulated clock is outputted.

The processing continues at step 308 where modulated feedback divider 208 outputs a modulated clock or an unmodulated clock according to the schedule determined in step 306. Accordingly, by modulating the comparison clock, the output PLL frequency and thus, the system output frequency may be changed. The average of the system output clock frequency over the period of the time subsequently equals the desired rate. Granularities finer than granularities provided by integer divider values are implemented using the modulation techniques.

Figure 4:
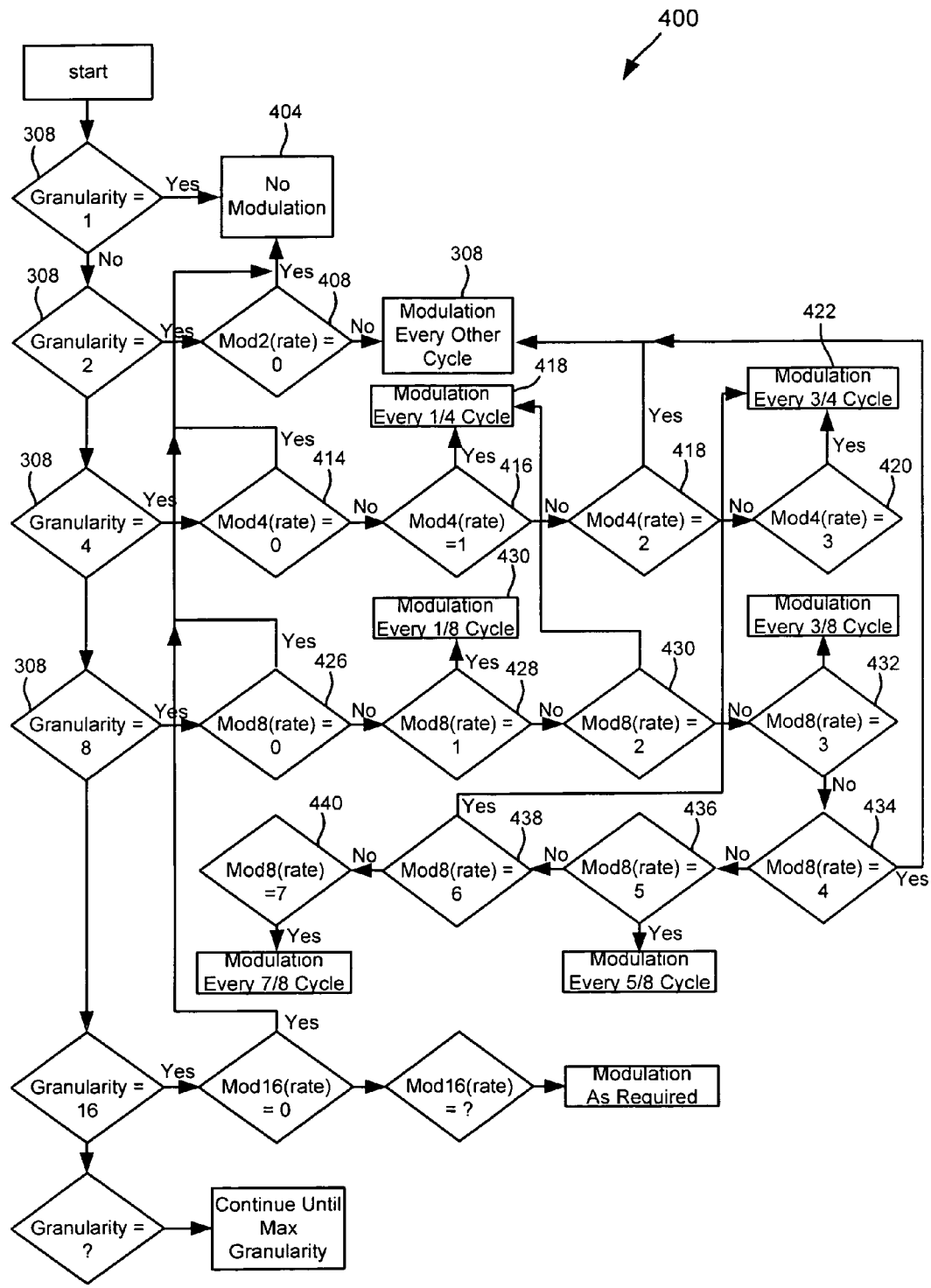
FIG. 4 shows a simplified flow chart that shows the implementation of determining when to modulate the comparison clock according to one embodiment of the present invention.

FIG. 4 shows a simplified flow chart 400 of a method for determining when to modulate the comparison clock according to one embodiment of the present invention. In step 402, if the desired frequency falls within a range of frequencies in Table 1 with a granularity of 1, then, in step 404, no modulation is necessary.

In step 404, if a granularity of 2 is determined for the desired rate, then it is determined if the mod of the desired rate equals 0. Because the granularity is two, the base for the mod operation is two. Thus mod 2(rate) is used to figure out the function necessary. ie. If 16000 bps is required that would be mod 2(16000)=0, if 16001 is required that would be mod 2(16001)=1. If the granularity that can be achieved is four than mod 4(rate) function would be used, etc. If it is, then in step 404 there is no modulation.

In step 410, if mod 2(rate) does not equal 0, then the comparison is modulated every other cycle.

In step 412, it is determined if the granularity is 4. If so, it is determined if mod 4(rate) equals 0 in step 414. If it does, there is no modulation. Because the granularity may be 4, then there may be four possible values of desired rates. Thus, four tests for the possible values are performed.

If, in step 416, mod 4(rate)=1, then in step 418, the comparison clock is modulated every 1/4 cycle. If mod 4(rate) does not equal 1, then it is determined if mod 4(rate)=2. If it does, the comparison clock is modulated every other cycle. If it does not, it is determined if mod 4(rate)=3 in step 420. If it is, then the comparison clock is modulated every 3/4 cycles in step 422.

The same process continues for a granularity of eight except that there are eight possible values of desired rates. Thus, the comparison clock may be not modulated or modulated every 1/8, 2/8, 3/8, . . . , 7/8 cycles. In step 424, if the granularity is 8, it is determined in step 426 if mod 8(rate)=0. If it is, then there is no modulation. If it is not, then in step 428 it is determined if mod 8(rate)=1. If it is, then in step 430, the comparison clock is modulated by every 1/8 cycles. If mod 8(rate) does not equal 1, it is determined if mod 8(rate)=2. If it is, then in step 432, the comparison clock is modulated by every 1/8 cycles. This process continues as shown for the granularities of 3, 4, 5, 6, and 7. The granularities for 3, 4, 5, 6 and 7 are modulated for every 3/8 cycle, every other cycle, every 5/8 cycle, every 3/4 cycle, and every 7/8 cycle in steps 434, 436, 438, 440, and 442.

If the granularity is 16, the process proceeds as described above but is not shown. It will be understood that the granularity may be unlimited and may proceed as described above.

Embodiments of the present invention provide many advantages. For example, a single stage PLL may be used to generate output frequencies with a granularity of 1 Hz, or less. Accordingly, valuable space on a chip or board may be saved. Also, complexity of providing for output frequencies is simplified.

In one embodiment, the implementation is a FPGA (Field Programmable Gate Array) that enables the system to interface equipment at rates between 64 Hz and 2048000 Hz. It is cost sensitive and can be easily ported. It can also be used to design frequency synthesizers with other ranges and constraints. And since it is fully reprogrammable, it can also be used to generate other rates that may be required, such as all n*56K or n*64K (where n=1, 2, 3, 4, . . . (or any integer value)) rates up to the saturation frequency (upper VCO max) of the PLL, where x is an integer. This covers a wide area of applications in the data communications arena.

The present invention can be implemented in the form of control logic in software or hardware or a combination of both. The control logic may be stored in an information storage medium as a plurality of instructions adapted to direct an information processing device to perform a set of steps disclosed in embodiment of the present invention. Based on the disclosure and teachings provided herein, a person of ordinary skill in the art will appreciate other ways and/or methods to implement the present invention.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A method for providing a clock frequency using a single stage phase locked loop (PLL) circuit, the method comprising:
   determining a desired rate;
   determining a granularity value corresponding to a range of clock frequencies that includes the desired rate;
   determining an unmodulated rate and a modulated rate based on the desired rate and the granularity value;
   determining a modulation schedule comprising specified output cycles of the single stage PLL circuit, wherein the modulation schedule is based on the granularity value and a difference between the modulated and unmodulated rates; and modulating, by a modulated feedback divider, between the unmodulated rate and the modulated rate as input to the single stage PLL based on the modulation schedule over a period of time, wherein an output rate of the single stage PLL circuit is substantially equal to the desired rate over the period of time.

2. The method of claim 1, wherein the single ge PLL outputs a PLL frequency, the method further comprising dividing the PLL frequency by an output divider value to generate the output rate.

3. The method of claim 1, wherein the single stage PLL receives a reference clock and outputs a PLL frequency based on the reference clock and the unmodulated and modulated rates.

4. The method of claim 1, wherein the modulated rate is generated by dividing the PLL frequency by a first value that is an integer multiple.

5. The method of claim 4, wherein the unmodulated rate is generated by dividing the PLL frequency by a second value that is an integer multiple.

6. A single stage phase lock loop circuit comprising:
a phase lock loop configured to receive a reference clock frequency and to produce an output signal at a desired rate;
a modulator configured to determine a granularity of the desired rate in relation to the reference clock frequency and a frequency range of the output signal which includes the desired rate, the modulator configured to determine a modulated rate and an unmodulated rate based on the desired rate and the granularity,
the modulator further configured to determine a schedule of modulation cycles based on the granularity and a difference between the modulated and unmodulated rates such that the modulator alternately provides a modulated rate and an unmodulated rate to the phase lock loop based upon the schedule of modulation cycles;
wherein the phase lock loop generates an output frequency based on the reference clock frequency and the modulated rate or unmodulated rate, wherein the modulated rate and unmodulated rate are alternatively received at predetermined output cycles based on the schedule, wherein an output rate of the PLL is substantially equal to a desired rate being at a granularity lower than that provided by integer dividers of a multiple of the reference clock frequency.

7. The circuit of claim 6, further comprising an output divider configured to divide the output frequency of the phase lock loop by an integer value.

8. The circuit of claim 7, wherein the output divider is implemented in digital logic.

9. The circuit of claim 6, wherein the modulator comprises a feedback divider, the feedback divider configured to divide the output frequency of the phase lock loop by an integer value to generate the modulated or unmodulated rates.

10. The circuit of claim 6, further comprising an input divider configured to divide a system clock frequency to generate the reference clock frequency.

11. The circuit of claim 6, wherein the modulator is implemented in digital logic.

12. A single stage phase lock loop circuit comprising:
a phase lock loop (PLL) configured to receive a reference clock frequency and a comparison clock frequency, wherein the PLL is configured to output a PLL output frequency;
a modulated feedback divider implemented in digital logic configured to output the comparison clock frequency, wherein the modulated feedback divider determines a granularity value in relation to a range of clock frequencies including a desired system output frequency, and outputs either an unmodulated clock frequency or a modulated clock frequency according to a modulation schedule, wherein the modulation schedule is based on the granularity value and a difference between the unmodulated and modulated clock frequencies;
an output divider implemented in digital logic configured to output a system output frequency by dividing the PLL output frequency,
wherein the system output frequency varies based on the modulated clock frequency or unmodulated clock frequency input to the PLL as the comparison clock frequency such that the system output frequency is substantially equal to the desired system output frequency over a period of time.

13. The PLL circuit of claim 12, wherein the modulated feedback divider divides the PLL output frequency by a first number that is an integer, wherein the first number is used to generate the unmodulated clock frequency.

14. The PLL circuit of claim 13, wherein the modulated feedback divider divides the PLL output frequency by a second number that is an integer, wherein the second number is used to generate the modulated clock frequency.

15. The PLL circuit of claim 12, wherein the schedule is based on a Pascal triangle.

* * * * *